(12) United States Patent
Zheng et al.

(10) Patent No.: US 10,163,630 B2
(45) Date of Patent: Dec. 25, 2018

(54) PRE-CLEAN OF SILICON GERMANIUM FOR PRE-METAL CONTACT AT SOURCE AND DRAIN AND PRE-HIGH K AT CHANNEL

(71) Applicant: Applied Materials, Inc., Santa Clara, CA (US)

(72) Inventors: Bo Zheng, Saratoga, CA (US); Avgerinos V. Gelatos, Redwood City, CA (US); Anshul Vyas, Milpitas, CA (US); Raymond Hoiman Hung, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/674,606

(22) Filed: Aug. 11, 2017

(65) Prior Publication Data
US 2017/0365468 A1    Dec. 21, 2017

Related U.S. Application Data

(63) Continuation of application No. 14/846,215, filed on Sep. 4, 2015, now Pat. No. 9,735,009.

(Continued)

(51) Int. Cl.
| | |
|---|---|
| *H01L 21/205* | (2006.01) |
| *C23C 16/02* | (2006.01) |
| *H01L 21/02* | (2006.01) |
| *C23C 16/44* | (2006.01) |
| *C23C 16/48* | (2006.01) |
| *H01L 21/67* | (2006.01) |

(52) U.S. Cl.
CPC .... *H01L 21/02661* (2013.01); *C23C 16/0245* (2013.01); *C23C 16/4405* (2013.01); *C23C 16/481* (2013.01); *H01L 21/02046* (2013.01); *H01L 21/02049* (2013.01); *H01L 21/02057* (2013.01); *H01L 21/02381* (2013.01); *H01L 21/02532* (2013.01); *H01L 21/02639* (2013.01); *H01L 21/67115* (2013.01); *H01L 21/67184* (2013.01); *H01L 21/67207* (2013.01)

(58) Field of Classification Search
CPC .......... H01L 21/02057; H01L 21/0206; H01L 21/02381; H01L 21/02661; H01L 21/02532; C23C 16/0227–16/0245
See application file for complete search history.

(56) References Cited

U.S. PATENT DOCUMENTS 6,313,042 B1    11/2001  Cohen et al.
2002/0157688 A1*  10/2002  Joo ....................... B08B 7/0071
                                                            134/19

(Continued)

*Primary Examiner* — Robert Bachner
*Assistant Examiner* — Molly Reida
(74) *Attorney, Agent, or Firm* — Patterson + Sheridan LLP

(57) ABSTRACT

The present disclosure generally relates to methods for removing contaminants and native oxides from substrate surfaces. The method includes exposing a surface of the substrate to first hydrogen radical species, wherein the substrate is silicon germanium having a concentration of germanium above about 30%, then exposing the surface of the substrate to a plasma formed from a fluorine-containing precursor and a hydrogen-containing precursor, and then exposing the surface of the substrate to second hydrogen radical species.

17 Claims, 5 Drawing Sheets

Related U.S. Application Data

(60) Provisional application No. 62/050,695, filed on Sep. 15, 2014.

(56) References Cited

U.S. PATENT DOCUMENTS

| | | | | |
|---|---|---|---|---|
| 2006/0228900 | A1* | 10/2006 | Dip | C23C 16/0245 438/774 |
| 2010/0327276 | A1* | 12/2010 | Holland | H01L 21/02381 257/42 |
| 2015/0040822 | A1* | 2/2015 | Olsen | C30B 25/186 117/97 |

* cited by examiner

PRE-CLEAN OF SILICON GERMANIUM FOR PRE-METAL CONTACT AT SOURCE AND DRAIN AND PRE-HIGH K AT CHANNEL

CROSS-REFERENCE TO RELATED APPLICATIONS

This application is a continuation of U.S. application Ser. No. 14/846,215, filed Sep. 4, 2015, which claims benefit of U.S. provisional patent application Ser. No. 62/050,695, filed Sep. 15, 2014, which is herein incorporated by reference.

BACKGROUND

Field

Implementations of the present disclosure generally relate to methods and apparatuses for removing contaminants and oxides from a substrate surface.

Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to ambient conditions at a typical substrate fabrication facility. For example, a native oxide layer may form on the monocrystalline silicon surface prior to deposition of the epitaxial layer. If the monocrystalline silicon were doped with germanium, germanium will react with the silicon and form silicon-germanium alloy as well as native oxides of germanium and/or silicon-germanium alloy on the surface of the germanium-doped silicon. Additionally, hydrocarbons present in the ambient environment may react with germanium oxides and form germanium carbons on the surface of the germanium-doped silicon. The presence of native oxides of germanium, silicon-germanium alloy, or carbon residues on the germanium-doped silicon surface not only negatively affects the quality of an epitaxial layer subsequently formed on the germanium-doped silicon surface, but is also difficult to remove during cleaning of the substrate.

Therefore, there is a need for methods for cleaning a substrate surface, especially for cleaning a substrate surface prior to performing an epitaxial deposition process.

SUMMARY

Implementations of the present disclosure generally relate to methods for removing contaminants and native oxides from substrate surfaces. In one embodiment, the method includes exposing a surface of the substrate to first hydrogen radical species, wherein the substrate is silicon germanium having a concentration of germanium above about 30%, and then exposing the surface of the substrate to a plasma formed from a fluorine-containing precursor and a hydrogen-containing precursor, and then exposing the surface of the substrate to second hydrogen radical species.

In another implementation, the method includes exposing a surface of the substrate to a plasma formed from a first fluorine-containing precursor and a first hydrogen-containing precursor in a first processing chamber, exposing the surface of the substrate to hydrogen radical species in a second processing chamber, wherein the substrate is silicon germanium having a concentration of germanium above about 30%, then exposing the surface of the substrate to a plasma formed from a second fluorine-containing precursor and a second hydrogen-containing precursor in the first processing chamber, then annealing the substrate in the first processing chamber, and then forming an epitaxial layer on the surface of the substrate in a third processing chamber, wherein the substrate is transferred between the first, second, and third processing chambers within one processing system without breaking vacuum.

In yet another implementation, the method includes removing native oxides or contaminants from the surface of the substrate by exposing the surface of the substrate to first hydrogen radical species, wherein the substrate has a concentration of germanium above 45% at source and drain regions of the substrate, then cleaning the surface of the substrate using a fluorine-containing plasma etch process, and then exposing the surface of the substrate to second hydrogen radical species, and then forming an epitaxial layer on the surface of the substrate, wherein the epitaxial layer has a concentration of germanium above about 70%.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
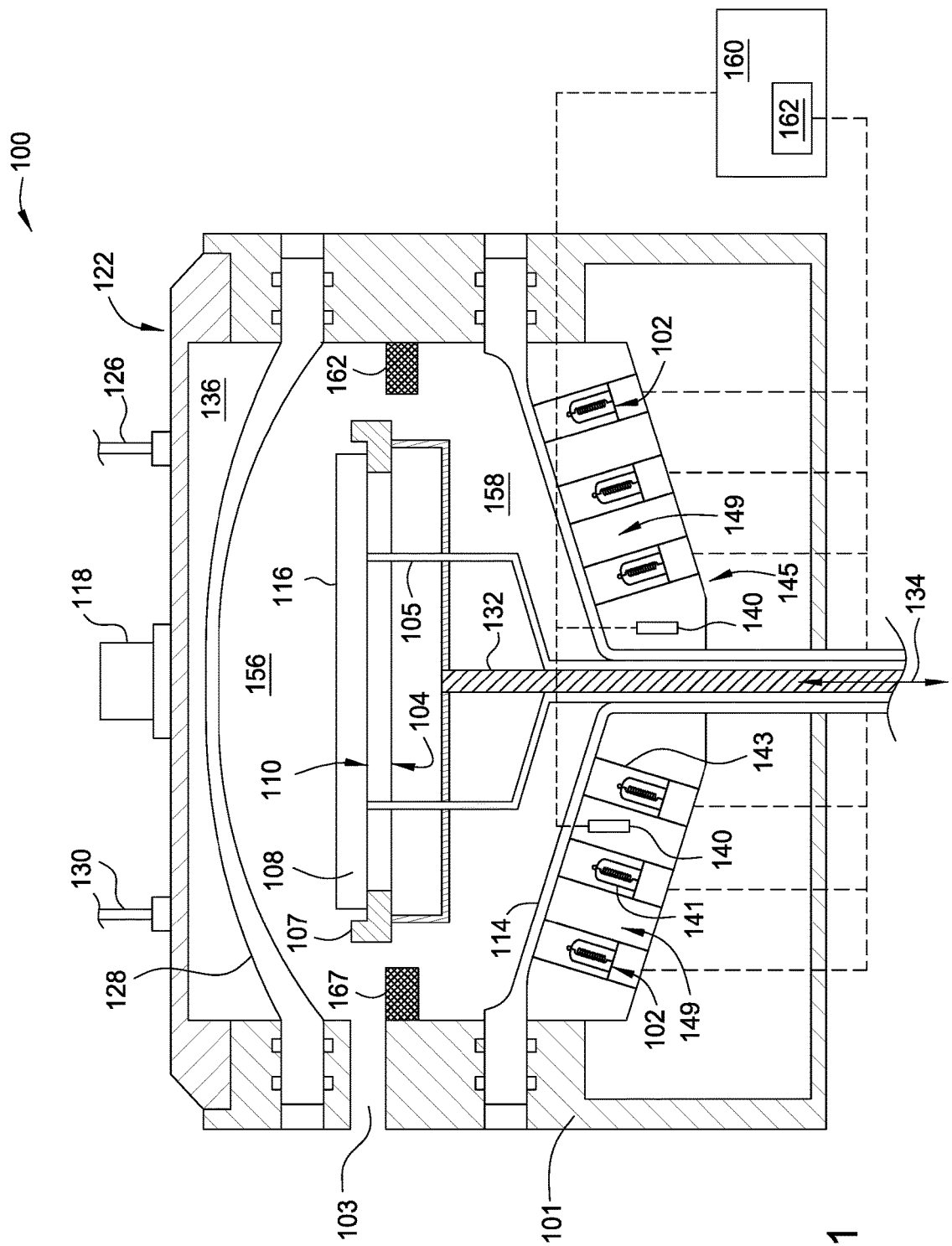
FIG. 1 is a schematic cross-sectional view of a processing chamber that may be used to perform certain processes according to implementations of the present disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations of the present disclosure generally relate to methods for removing contaminants and native oxides from substrate surfaces. The methods generally include removing contaminants disposed on the substrate surface using hydrogen radicals, and then cleaning the substrate surface by use of a remote plasma assisted dry etch process.

FIG. 1 is a schematic cross-sectional view of a processing chamber 100 that may be used to perform certain processes according to implementations of the present disclosure. The processing chamber 100 may be used to process one or more substrates, including the deposition of a material on an upper surface of a substrate 108. The processing chamber 100 generally includes an array of radiant heating lamps 102 for heating, among other components, a back side 104 of a substrate support 107 disposed within the processing chamber 100. The substrate support 107 may be a ring-like substrate support as shown, which supports the substrate from the edge of the substrate, a disk-like or platter-like substrate support, or a plurality of pins, for example three pins. The substrate support 107 is located within the processing chamber 100 between an upper dome 128 and a lower dome 114. The substrate 108 (not to scale) can be brought into the processing chamber 100 and positioned onto the substrate support 107 through a loading port 103.

The substrate support 107 is shown in an elevated processing position, but may be vertically traversed by an actuator (not shown) to a loading position below the processing position to allow lift pins 105 to contact the lower dome 114, passing through holes in the substrate support 107, and raise the substrate 108 from the substrate support 107. A robot (not shown) may then enter the processing chamber 100 to engage and remove the substrate 108 therefrom though the loading port 103. The substrate support 107 then may be actuated up to the processing position to place the substrate 108, with its device side 116 facing up, on a front side 110 of the substrate support 107.

The substrate support 107, while supporting the substrate 204 in the processing position, divides the internal volume of the processing chamber 100 into a processing gas region 156 (above the substrate) and a purge gas region 158 (below the substrate support 107). The substrate support 107 is rotated during processing by a central shaft 132 to minimize the effect of thermal and processing gas flow spatial anomalies within the processing chamber 100 and thus facilitate uniform processing of the substrate 108. The substrate support 107 is supported by the central shaft 132, which moves the substrate 108 in an up and down direction 134 during loading and unloading, and in some instances, processing of the substrate 108. The substrate support 107 is typically formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and conduct the radiant energy to the substrate 108. The substrate support 107 is shown in FIG. 1 as a ring with a central opening to facilitate exposure of the substrate to the thermal radiation from the lamps 102. The substrate support 107 may also be a platter-like member with no central opening.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The upper dome 128 may be thermally controlled by introducing a thermal control fluid, such as a cooling gas, through a inlet portal 126 into a thermal control space 136, and withdrawing the thermal control fluid through an exit portal 130. In some implementations, a cooling fluid circulating through the thermal control space 136 may reduce deposition on an inner surface of the upper dome 128.

One or more lamps, such as an array of lamps 102, can be disposed adjacent to and beneath the lower dome 114 in a specified, optimal desired manner around the central shaft 132 to heat the substrate 108 as the processing gas passes over, thereby facilitating the deposition of a material onto the upper surface of the substrate 108. In various examples, the material deposited onto the substrate 108 may be a group III, group IV, and/or group V material, or may be a material including a group III, group IV, and/or group V dopant.

The lamps 102 may be adapted to heat the substrate 108 to a temperature within a range of about 200 degrees Celsius to about 1200 degrees Celsius (e.g., from about 300 degrees Celsius to about 950 degrees Celsius). The lamps 102 may include bulbs 141 surrounded by an optional reflector 143. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflector 143. If desired, the lamphead 145 may or may not be in contact with the lower dome 114.

A circular shield 167 may be optionally disposed around the substrate support 107 and coupled to sidewall of the chamber body 101. The shield 167 prevents or minimizes leakage of heat/light noise from the lamps 102 to the device side 116 of the substrate 108 in addition to providing a pre-heat zone for the processing gases. The shield 167 may be made from CVD SiC coated sintered graphite, grown SiC, or a similar opaque material that is resistant to chemical breakdown by processing and cleaning gases.

A reflector 122 may be optionally placed outside the upper dome 128 to reflect infrared light that is radiating off the substrate 108 back onto the substrate 108. Due to the reflected infrared light, the efficiency of the heating will be improved by containing heat that could otherwise escape the processing chamber 100. The reflector 122 can be made of a metal such as aluminum or stainless steel. The reflector 122 can have machined channels (not shown) to carry a flow of a fluid such as water for cooling the reflector 122. If desired, the efficiency of the reflection can be improved by coating a reflector area with a highly reflective coating such as with gold.

A plurality of thermal radiation sensors 140, which may be pyrometers, are disposed in the lamphead 145 for measuring thermal emissions of the substrate 108. The sensors 140 are typically disposed at different locations in the lamphead 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are used, but more than two may be used. Different implementations may use three, four, five, six, seven, or more sensors 140.

Each sensor 140 views a zone of the substrate 108 and senses the thermal state of a zone of the substrate. The zones may be oriented radially in some implementations. For example, in implementations where the substrate 108 is rotated, the sensors 140 may view, or define, a central zone in a central portion of the substrate 108 having a center substantially the same as the center of the substrate 108, with one or more zones surrounding the central zone and concentric therewith. It is not required that the zones be concentric and radially oriented, however. In some implementations, zones may be arranged at different locations of the substrate 108 in non-radial fashion.

The sensors 140 are typically disposed between the lamps 102, for example in the channels 149, and are usually oriented substantially normal to the substrate 108. In some implementations the sensors 140 are oriented normal to the substrate 108, while in other implementations, the sensors 140 may be oriented in slight departure from normality. An orientation angled within about 5° of normal is most frequently used.

The sensors 140 may be attuned to the same wavelength or spectrum, or to different wavelengths or spectra. For example, substrates used in the processing chamber 100 may be compositionally homogeneous, or they may have domains of different compositions. Using sensors 140 attuned to different wavelengths may allow monitoring of substrate domains having different composition and different emission responses to thermal energy. Typically, the sensors 140 are attuned to infrared wavelengths, for example about 4 μm.

A top thermal sensor 118 may be disposed in the reflector 122 to monitor a thermal state of the upper dome 128, if desired, or to monitor the thermal state of the substrate 108 from a viewpoint opposite that of the sensors 140. Such monitoring may be useful to compare to data received from the sensors 140, for example to determine whether a fault exists in the data received from the sensors 140. The top thermal sensor 118 may be an assembly of sensors in some cases, featuring more than one individual sensor. Thus, the processing chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each lamp 102, or individual groups of lamps or lamp zones, based on the data. The controller 160 may include a power supply 162 that independently powers the various lamps or lamp zones. The controller 160 can be configured with a desired temperature profile, and based on comparing the data received from the sensors 140; the controller 160 adjusts power to lamps and/or lamp zones to conform the observed thermal data to the desired temperature profile. The controller 160 may also adjust power to the lamps and/or lamp zones to conform the thermal treatment of one substrate to the thermal treatment of another substrate, in the event chamber performance drifts over time.

Exemplary Process

Figure 2:
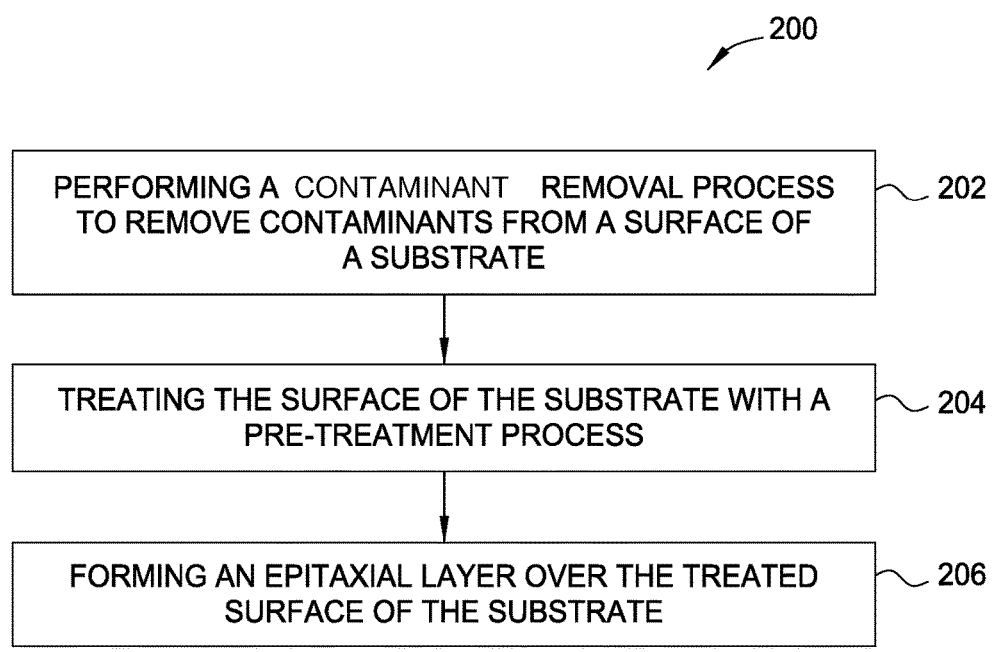
FIG. 2 illustrates a process sequence according to implementations of the present disclosure.

FIG. 2 illustrates a process sequence 200 according to embodiments of the present disclosure. The process sequence 200 begins at block 202. In block 202, a contaminant removal process is performed to remove contaminants from a surface of a substrate. The substrate may be any substrate that an epitaxial layer can be formed on. These substrates may include, for example, substrate wafers made from silicon (Si) (doped or undoped), polysilicon, crystalline silicon (e.g., Si<100> or Si<111>), silicon oxide, strained silicon, silicon germanium, doped or undoped polysilicon, germanium, sapphire ($Al_2O_3$), silicon carbide (SiC), spinel, zinc oxide, as well as compound semiconductor substrates such as gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST) other chalcogenide materials, patterned or non-patterned substrates, among other substrates. In one embodiment, the substrate is silicon germanium alloys (SiGe). In some applications where high concentration of germanium is required, for example PMOS source and drain materials used in conductive nodes advancing 7 nm and beyond, the concentration of germanium at PMOS source/drain may be above about 30%, for example about 45% or more, such as about 70% to about 100%. The surface of the substrate may have contaminants and/or an oxide layer, such as carbon residue and/or native oxide layer of Si, Ge, SiGe, or substrate materials listed above, disposed thereon. Due to the sensitivity of epitaxial deposition processes to contaminants, such as carbon-containing contaminants, exposure to most typical cleanroom environments for a few hours will allow a significant amount of contaminants to re-accumulate on the surface of the substrate such that the accumulated contaminants will affect the quality of the subsequently formed epitaxial layer.

In some implementations of block 202, contaminants may be removed from a surface of the substrate by exposing the surface of the substrate to hydrogen radical species and/or energetically excited neutral species of hydrogen. Hydrogen radicals or energetically excited neutral species of hydrogen may be formed in situ in the processing chamber in which the substrate is disposed using a hydrogen-containing gas. The hydrogen-containing gas may include, but is not limited to ammonia ($NH_3$), hydrazine ($N_2H_4$), or $H_2$.

In some implementations, hydrogen radicals or energetically excited neutral species of hydrogen may be formed within the processing chamber by exposing the hydrogen-containing gas to a HWCVD (hot wire chemical vapor deposition) source disposed within the internal processing volume between a gas distribution plate and the surface of the substrate. The HWCVD source may include a plurality of metal filaments or wires surrounded by quartz. The plurality of metal filaments or wires may be in a parallel arrangement to the substrate surface. The plurality of wires may be one or more wires routed back and forth across the processing volume. The filaments or wires may be made of, for example, tantalum, tungsten, or molybdenum. The use of HWCVD is believed to provide longer lifetime of radicals or neutral species. During process, the metal filaments or wires may be heated up to a temperature range of about 1000° C. to about 2000° C. at a chamber pressure of about 10 mTorr or above.

In some implementations, hydrogen radicals or energetically excited neutral species of hydrogen may be formed using a plasma in PECVD or UV light. Alternatively, hydrogen radicals or energetically excited neutral species of hydrogen may be formed using a hydrogen-containing gas in a remote plasma reactor separated from the processing chamber. The remote plasma reactor may be connected to the processing chamber through a delivery pipe. In either case, various ion filters, such as electrostatic filters operated at a bias of, for example, about 200V (RF or DC), wire or mesh filters, or magnetic filters, any of which may have a dielectric coating, may be used in the processing chamber or between the remote plasma reactor and the processing chamber to eliminate majority or all ions present in the plasma at the plasma generation (with the radicals and/or neutral species) prior to coming in contact with the surface of the substrate.

The hydrogen plasma may be inductively or capacitively coupled to remove contaminants from a surface of a substrate. The hydrogen plasma may be energized by a microwave source, an RF source, or thermally formed in a processing chamber or in the remote plasma generator. In one example of the contaminant removal process performed in block 202, a hydrogen containing plasma may be generated with an RF power of between about 10 W and about 500 W at an RF frequency of 13.56 MHz, while the substrate 202 is maintained at a temperature of between about 15° C. and about 500° C. and the processing pressure in the processing region 222 is maintained at a pressure of about 10 mTorr to about 2 Torr. In one embodiment, the plasma is inductively coupled, the processing temperature may be about 400 degrees Celsius (° C.) and the processing pressure may be about 20 milliTorr (mTorr). In one example, the hydrogen ($H_2$) gas in inert gas concentration during processing may be between 2% and 100%. The processing time may be between 2 seconds to about 15 seconds, for example about 3 seconds to about 10 seconds.

Exposing the surface of the substrate to hydrogen radicals and/or energetically excited neutral species of hydrogen has been observed by the present inventors to be effective in removing native oxides of germanium, silicon-germanium alloy, and/or silicon, and carbon based contaminants formed due to reactions between germanium and hydrocarbons in the processing region. Delivering RF energy to the processing region causes the gas atoms in the processing region (in which the substrate is placed) to become ionized. When the substrate is exposed to plasma generated in or distributed to the processing region during operation, the radicals and/or ions generated in the plasma will interact with the contamination disposed on the surface of the substrate causing it to desorb or be physically removed therefrom. In some configurations the plasma may knock off or cause the contaminants to desorb from the surface due to the energy transferred by the ionized atoms in the plasma striking the surface of the substrate. As noted above, in some implementations, it is desirable to minimize the amount of energy the plasma generated species have to reduce the chance of roughening the surface during processing. In some implementations, it may be advantageous to form a larger percentage of gas radicals versus energetic ionized species. In such a case, a distribution plate with an ion filter may be disposed in the processing region such that the surface of the substrate is exposed to only or substantially hydrogen radicals and/or energetically excited neutral species of hydrogen.

Figure 4:
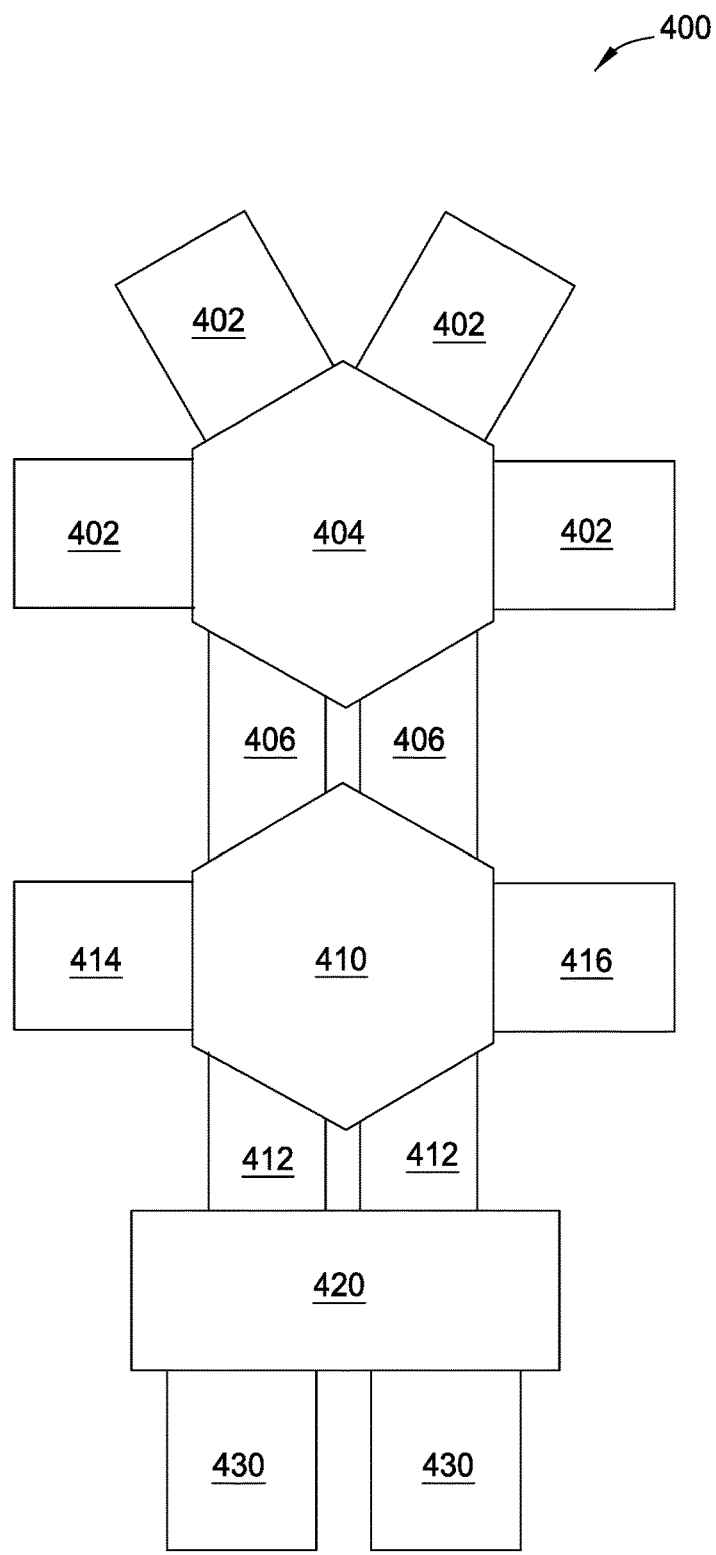
FIG. 4 illustrates a processing system that can be used to complete the processing sequence illustrated in FIG. 2 according to implementations of the present disclosure.

In block 204, the surface of the substrate is further treated using a pre-treatment process. The pre-treatment process may involve exposing the surface of the substrate to at least one of cleaning, polishing, etching, reducing, oxidizing, hydroxylating, annealing, and/or baking the substrate surface. In some implementations where processing of the substrate is performed ex-situ to the processing system or cluster tool as shown in FIG. 4, the substrate may be subjected to a pre-clean and/or degas process upon entering the cluster tool.

In some embodiments, the pre-treatment process includes a plasma etch process. The plasma etch process may be a SICONI™ etch process used to remove remaining native oxides from the surface of the substrate through a low-temperature, two-part dry chemical clean process using $NF_3$ and $NH_3$. Exemplary chambers in which the pre-treatment process of block 204 may be performed include the SICONI™ chamber, which is available from Applied Materials, Inc. of Santa Clara, Calif. The pre-treatment process of block 204 has been observed to be able to remove at least native oxides of Si and SiGe.

In some implementations, the substrate may be exposed to a fluorine-containing precursor and a hydrogen-containing precursor in a two part dry chemical clean process. In some implementations, the fluorine-containing precursor may comprise nitrogen trifluoride ($NF_3$), hydrogen fluoride (HF), diatomic fluorine ($F_2$), monatomic fluorine (F) and fluorine-substituted hydrocarbons, combinations thereof, or the like. In some implementations, the hydrogen-containing precursors may comprise atomic hydrogen (H), diatomic hydrogen ($H_2$), water vapor ($H_2O$), ammonia ($NH_3$), hydrocarbons, incompletely halogen-substituted hydrocarbons, combinations thereof, or the like. In some other implementations, the substrate may be exposed to a fluorine-containing precursor or a hydrogen-containing precursor as discussed herein.

In some implementations, the first part in the two part process may comprise using a remote plasma source to generate an etchant species (e.g., ammonium fluoride ($NH_4F$)) from the fluorine-containing precursor (e.g., nitrogen trifluoride ($NF_3$)) and the hydrogen-containing precursor (e.g., ammonia ($NH_3$)). In some embodiments, etchant species $HF/H_2O$ or $HF/NH_3$ is used. By using a remote plasma source, damage to the substrate may be minimized. The etchant species are then introduced into the pre-clean chamber and condensed into a solid by-product on the substrate surface through a reaction with remaining native oxide layer. The second part may then comprise an in-situ anneal to decompose the by-product using convection and radiation heating. The by-product then sublimates and may be removed from the substrate surface via a flow of gas and pumped out of the pre-clean chamber.

In some implementations where the pre-treatment process is a high temperature bake process, the substrate may be exposed to a high temperature in a hydrogen-containing environment to remove remaining native oxides from the surface of the substrate.

In one exemplary implementation where a 300 mm substrate is used, a plasma etch process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. The plasma etch process may be performed at a pressure of about 5 Torr, and an RF power setting of about 30 W may be utilized to ionize the $NF_3$ and the $NH_3$. By-products may then be sublimated from the surface of the substrate by annealing the substrate at a temperature of about 120° C. or more for about 5 seconds to about 100 seconds, such as about 60 seconds. Other implementations of fluorine based etch process may involve, reacting $NH_3$ gas and $F_2$ or anhydrous HF gas in either plasma or thermal heat to etch $SiO_2$ native oxides. Examples of gas flow ratios would be 1:1 to 1:10, for example 1:3 to 1:6, gas flow ratio of fluorine gas to $NH_3$ gas at temperatures of 15° C. to 130° C.

In some implementations, blocks 202 and 204 may be performed in-situ, i.e., on the same mainframe or in one processing system or cluster tool as shown in FIG. 4 so that the substrate is not oxidized again during transfer.

It should be understood that various process sequences are contemplated. For example, the process sequence may be performed so that the pre-treatment process described in block 204 is performed prior to the contaminant removal process described in block 202, i.e., pre-treatment process (block 204)→contaminant removal process (block 202). In some implementations, the process sequence may be performed in a sequence of: contaminant removal process (block 202)→pre-treatment process (block 204)→contaminant removal process (block 202). In some implementations, the process may be performed in a sequence of: pre-treatment process (block 204)→contaminant removal process (block 202)→pre-treatment process (block 204). In any case, the process sequence may be repeated as necessary to obtain the desired cleaning result.

Table 1 below shows cleaning results between various processes (with and/or without contaminant removal process and the pre-treatment process) and a reference process (no cleaning) based on a SiGe substrate (where the concentration of germanium is 45%). The tested substrates were capped by a cap layer of TiN (600 Å) after cleaning to prevent re-oxidation due to air exposure. Impurities at the interface of TiN/SiGe on non-cleaned samples and post-cleaned samples were detected using secondary ion mass spectrometry (SIMS) technique. Negative number indicates an increase in impurity content while positive number indicates a decrease in impurity content. As can be seen in split (1), the pre-treatment process (block 204) alone may show insufficient or zero carbon reduction at the surface/interface of the substrate. In split (2), the contaminant removal process (block 202) alone may show insufficient or zero oxygen reduction at the surface/interface of the substrate. In split (3), the combination of the contaminant removal process (block 202) and the pre-treatment process (block 204) in a 204→202 sequence order yields improved oxygen, carbon reduction, and fluorine reduction at the surface/interface of the substrate. In split (4), the combination of the contaminant removal process (block 202) and the pre-treatment process (block 204) in a 202→204 sequence order yields improved oxygen and carbon reduction and fluorine increment at the surface/interface of the substrate.

TABLE 1

| Split | Experiment | Oxygen reduction | Carbon reduction | Fluorine reduction | Etch (Å) Block (204) | Etch (Å) Block (202) |
|---|---|---|---|---|---|---|
| 1 | Block 204 | 68% | 0 | −27.6% | 50 | 0 |
| 2 | Block 202 | 0 | 56.0% | 82.4% | 0 | 100 |
| 3 | Block 204→ 202 | 77.5% | 50.7% | 44.4% | 50 | 100 |
| 4 | Block 202→ 204 | 85.6% | 56.9% | −26.8% | 50 | 100 |
| 5 | No clean | Reference | Reference | Reference | 0 | 0 |

Table 2 below shows cleaning results between various processes (with and/or without contaminant removal process and the pre-treatment process) on different substrates. All percentages are relative to untreated control sample. Again, the tested substrates were capped by a cap layer of TiN (600 Å) to prevent re-oxidation before air exposure. Impurities at the interface of TiN/SiGe (or Si or Ge) on post-cleaned samples were detected using secondary ion mass spectrometry (SIMS) technique. Negative number indicates an increase in impurity content while positive number indicates a decrease in impurity content at the surface/interface of the substrate. As can be seen, on SiGe (Ge 45%) substrate, the combination of the contaminant removal process (block 202) and the pre-treatment process (block 204) in a 202→204→202 sequence order yields the best at reducing all three impurities (oxygen, carbon and fluorine). For example, there is 98.9% interfacial oxide reduction as compared with 73.6% oxide reduction by pre-treatment process (block 204) only. Carbon reduction of 55% as compared with no carbon reduction with pre-treatment process (block 204) only. On pure Ge substrate, however, the contaminant removal process (block 202) is more effective than the pre-treatment process (block 204) in removing oxygen, carbon and fluorine. 50 Å is an exemplary amount of oxides being etched.

TABLE 2

| Substrate | Experiment | Oxygen reduction (%) | Carbon reduction (%) | Fluorine reduction (%) |
|---|---|---|---|---|
| Si | Block 204 (50 Å) | 96% | −110.3% | −2625.9% |
| SiGe(Ge 45%) | Block 204 (50 Å) | 73.6% | −82.4% | −2251.3% |
| SiGe(Ge 45%) | Block 202 → Block 204 (50 Å) | 98.9% | 55.5% | −1030.0% |
| SiGe(Ge 45%) | Block 202 → Block 204 (50 Å) → Block 202 | 97.6% | 82.0% | 97.0% |
| Ge | Block 204 | 89.4% | −286.6% | −380.1% |
| Ge | Block 202 | 95% | 89.7% | −6.7% |

Table 3 below shows etch amount of a polysilicon (Poly Si) substrate treated with different process time/sequences according to implementations of the present disclosure. 50 Å is an exemplary amount of oxides being etched. As can be seen, Poly Si loss was 4 Å with pre-treatment process (block 204) only, and 7.8 Å with contaminant removal process (block 202) of 8 seconds followed by pre-treatment process (block 204) and 67 Å with pre-treatment process (block 204) followed by contaminant removal process (block 202) of 8 seconds. However, the tested substrates 6 and 7 show a similar or lower Si loss with improved cleaning results as discussed above. In contrast, the tested substrates 4 and 5 show a significant higher Si loss. This may due to interaction of F termination from the pre-treatment process (block 204) and hydrogen radicals from the contaminant removal process (block 202). Table 3 also shows that Si loss is reduced when a degas treatment (for removal of moisture) at a temperature of about 250° C. or above.

TABLE 3

| Substrate | Experiment | Mean (Å) | Center (Å) |
|---|---|---|---|
| 1 | Block 202 (4 sec) | 5.21 | 7.32 |
| 2 | Block 202 (8 sec) | 7.87 | 10.51 |
| 3 | Block 204 (50 Å) | 4.01 | 3.21 |
| 4 | Block 204 (50 Å) → Block 202 (4 sec) | 46.21 | 38.3 |
| 5 | Block 204 (50 Å) → Block 202 (8 sec) | 67.47 | 57.23 |
| 6 | Block 202 (4 sec) → Block 204 (50 Å) | 4.07 | 5.51 |

TABLE 3-continued

| Substrate | Experiment | Mean (Å) | Center (Å) |
|---|---|---|---|
| 7 | Block 202 (8 sec) → Block 204 (50 Å) | 6.79 | 11.18 |
| 8 | Block 204 →Degas (250° C.) → Block 202 (8 sec) | 37.97 | 5.68 |
| 9 | Block 204 → Degas (400° C.) → Cool → Block 202 (8 sec) | 39.42 | 30.23 |

Figure 3:
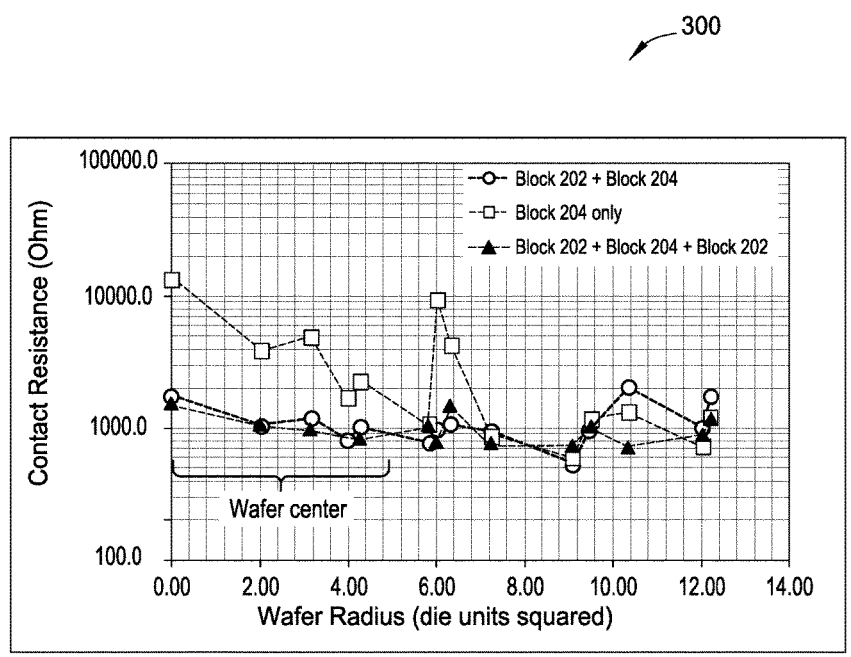
FIG. 3 illustrates a graph of contact resistance (Rc) between various processes as a function of the substrate radius.

FIG. 3 illustrates a graph of contact resistance (Rc) between various processes as a function of the substrate radius. As can be seen, there is a correction of high flux of hydrogen radicals to low contact resistance. In addition, contact resistance is much higher with contaminant removal process (block 202) and pre-treatment process (block 204) than with pre-treatment process (block 204) alone.

Next, in block 206, an epitaxial layer may be formed over the treated surface of the substrate. The treated surface of the substrate is contaminant free which improves the quality of the epitaxial layer subsequently formed on the surface of the substrate. In some embodiments, the epitaxial layer may include one or more device layers and/or active material layers. The active material layer may include for example, a p-n junction, which is necessary for the fabrication of the desired semiconductor device, such as light emitting diodes (LEDs), laser diodes (LDs), or other electronic applications such as transistors. It is contemplated that the process of the present disclosure is suitable for use with more sophisticated structures. Such structures may include those that use one or more quantum wells as active layers or superlattice structures as part of the crystal transition between the substrate and the device layers, for example. In various implementations, the epitaxial layer may be a germanium layer, a silicon layer, or a silicon germanium layer.

In one example, the epitaxial deposition may be a selective epitaxial deposition process performed at a temperature that is less than 800° C. In this example, the temperature is set such that it will not exceed 800° C., in order to limit the substrate thermal budget for delicate features that may distort or diffuse if overheated. In one implementation, the epitaxial layer is deposited using a high temperature chemical vapor deposition (CVD) process. In this thermal CVD process, processing gases such as dichlorosilane, silane, disilane, germane, hydrogen chloride, or combinations thereof may be used to deposit the epitaxial layer. The processing temperature is under 800° C. and the processing pressure is between 5 and 600 Torr. When blocks 202, 204 and 206 are performed, contaminants at the surface of the substrate have been reduced and the epitaxial layer formed is relatively defect free.

The processes described in blocks 202 and 204 may be used to clean contact plugs, via, gate electrodes, elevated source/drains, source/drain extensions, channel, or any semiconductor features or interconnect components before and/or after the epitaxial deposition process is completed.

The processes described in blocks 202 and 204 may be used in various applications. For example, in some implementations the processes may be used in the contact application where the substrate may have high concentration of $SiGe_x$ (x could be up to 77% or more, for example about 80%-100%) at PMOS source/drain. In such a case, the processes described in blocks 202 and 204 may be performed to pre-clean the substrate surface, then a metal deposition process by CVD or PVD may be performed to deposit a silicide metal. A barrier layer such as CVD TiN or WN may then be deposited on the silicide metal. All these processes may be performed on the same mainframe without breaking vacuum. Thereafter, the substrate is transferred to a CVD chamber to deposit a conductive material such as tungsten.

In some implementations, the processes described in blocks 202 and 204 may be performed prior to source/drain deposition where the substrate may be Si or have low concentration of Ge (for example about 30% for conductive nodes advancing 7 nm and beyond). In such a case, the sequence may include the processes described in blocks 202 and 204 to pre-clean the substrate surface, and then an epitaxial process of SiGe (high concentration of Ge such as about 75% or more) for PMOS.

In some implementations, the processes described in blocks 202 and 204 may be performed prior to gate deposition. In such a case, if the channel has low concentration of SiGe, then the processes described in blocks 202 and 204 may be performed to pre-clean the substrate surface and followed by high-k material deposition process. These pre-clean and deposition processes may be performed on the same mainframe without breaking vacuum.

In some implementations, blocks 202, 204 and 206 may be performed in one processing system or cluster tool as shown in FIG. 4. In some embodiments, block 202 may be performed in a processing chamber that is not within the processing system that contains processing chambers in which blocks 204 and 206 are performed, or, block 204 may be performed in a processing chamber that is not within the processing system that contains processing chambers in which blocks 202 and 206 are performed.

FIG. 4 illustrates a processing system 400 that can be used to complete the processing sequence 200 illustrated in FIG. 2 according to implementations of the present disclosure. As shown in FIG. 4, a plurality of processing chambers 402 is coupled to a first transfer chamber 404. The first transfer chamber 404 is also coupled to a first pair of processing chambers 406. The first transfer chamber 404 has a centrally disposed transfer robot (not shown) for transferring substrates between the processing chambers 406 and the processing chambers 402. The processing chambers 406 are coupled to a second transfer chamber 410, which is coupled to a processing chamber 414 for removing contaminants (block 202) and a cleaning chamber 416 for treating the substrate (block 204). The second transfer chamber 410 has a centrally disposed transfer robot (not shown) for transferring substrates between a set of load lock chamber 412 and the processing chamber 414 or the cleaning chamber 416. A factory interface 420 is connected to the second transfer chamber 410 by the load lock chambers 412. The factory interface 420 is coupled to one or more pods 430 on the opposite side of the load lock chambers 412. The pods 430 typically are front opening unified pods (FOUP) that are accessible from the clean room.

During operation, a substrate is first transferred to the processing chamber 414 in which a contaminant removal process is performed to remove native oxides of germanium, silicon-germanium alloy, and/or silicon, and carbon based contaminants from the substrate surface. The contaminants removal process is described in FIG. 2 under block 202. Then the substrate is transferred to the cleaning chamber 416 in which block 204 is performed. The clean substrate is then transferred to one or more processing chambers 402 in which the epitaxial deposition, as described under block 206 is performed. Because all three blocks 202, 204 and 206 are performed within the same processing system, vacuum is not broken as the substrate is transferred to various chambers, which decreases the chance of contamination and improves the quality of the deposited epitaxial film.

Figure 5:
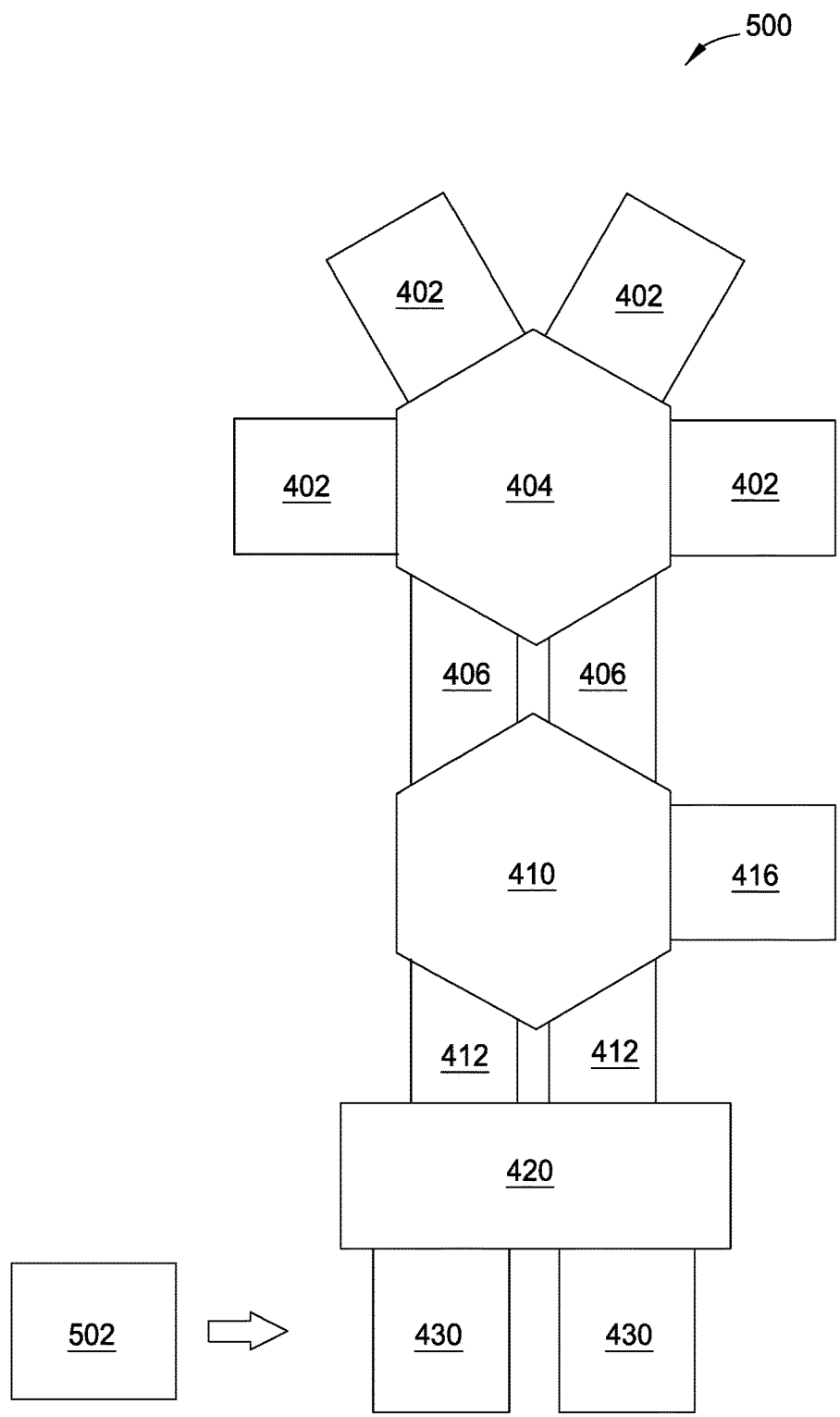
FIG. 5 illustrates another processing system that can be used to complete the processing sequence illustrated in FIG. 2 according to implementations of the disclosure.

In another embodiment, the contaminants removal process 202 is performed in a chamber that is not a part of the processing system that contains the cleaning chamber 416 and the one or more processing chambers 402. As shown in FIG. 5, contaminants on the substrate surface are removed in a processing chamber 502. The substrate is then transferred to the processing system 500, which is the processing system 400 without the processing chamber 414. The substrate is transferred to the cleaning chamber 416 in which block 204 is performed. Then the substrate is transferred to at least one of the processing chambers 402 in which block 206 is performed.

In summary, methods of removing contaminants and/or native oxides from a substrate surface and cleaning the substrate prior to epitaxial deposition are disclosed. The method includes a contaminant removal process which exposes the substrate surface to hydrogen radicals and/or energetically excited neutral species of hydrogen to remove native oxide of Ge and carbon residue, and then followed by a pre-treatment process which treats the substrate surface with a fluorine-containing plasma etch to remove native oxide of Si in-situ. The substrate surface may be optionally exposed to hydrogen radicals and/or energetically excited neutral species of hydrogen to enhance removal native oxide removal. Since the fluorine containing-plasma etch may be ineffective in removing the contaminants which can be Si—Ge alloy, hydrocarbon or carbon based contaminants, the contaminant removal process prior to the plasma etch helps removing the contaminants, which in turn improves the quality of the epitaxial layer subsequently deposited on the substrate. The proposed sequence provides most efficient native oxide removal, and carbon reduction and much reduced Si and SiGe loss post pre-clean processes as compared to conventional approach using fluorine-containing plasma treatment alone. For example, with the proposed sequence recited in this disclosure, 98.9% interfacial oxide reduction was observed by the inventors, as compared to 73.6% oxide reduction using fluorine-containing plasma treatment only. Carbon reduction of 55% was observed with the proposed sequence recited in this disclosure, as compared to no carbon reduction using fluorine-containing plasma treatment only.

While the foregoing is directed to implementations of the present disclosure, other and further implementations of the disclosure may be devised without departing from the basic scope thereof, and the scope thereof is determined by the claims that follow.

The invention claimed is:

1. A method for processing a substrate, comprising:
exposing a surface of the substrate to hydrogen radical species;
exposing the surface of the substrate to a plasma formed from a first fluorine-containing precursor and a first hydrogen-containing precursor;
annealing the substrate;
exposing the surface of the substrate to a plasma formed from a second fluorine-containing precursor and a second hydrogen-containing precursor in a first processing chamber; and
forming an epitaxial layer on the surface of the substrate.

2. The method of claim 1, wherein the substrate is silicon germanium having a concentration of germanium in silicon above about 30%.

3. The method of claim 1, wherein the hydrogen radical species are formed by exposing a hydrogen-containing gas to a hot wire chemical vapor deposition (HWCVD) source.

4. The method of claim 1, wherein the hydrogen radical species are formed by exposing a hydrogen-containing gas to a UV light.

5. The method of claim 1, wherein exposing the surface of the substrate to hydrogen radical species is performed in the first processing chamber.

6. The method of claim 5, wherein the hydrogen radical species are formed in a remote plasma source separated from the first processing chamber.

7. The method of claim 5, wherein the exposing a surface of the substrate to a plasma formed from a first fluorine-containing precursor and a first hydrogen-containing precursor is performed in the first processing chamber.

8. The method of claim 5, wherein the exposing a surface of the substrate to a plasma formed from a first fluorine-containing precursor and a first hydrogen-containing precursor is performed in a second processing chamber.

9. The method of claim 8, wherein the forming an epitaxial layer on the surface of the substrate is performed in a third processing chamber.

10. The method of claim 1, wherein the substrate comprises doped silicon, undoped silicon, polysilicon, crystalline silicon, silicon oxide, strained silicon, silicon germanium, doped polysilicon, germanium, sapphire ($Al_2O_3$), silicon carbide (SiC), spinel, zinc oxide, gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST), or combinations thereof.

11. The method of claim 1, wherein the first and second fluorine-containing precursors comprise one or more of nitrogen trifluoride ($NF_3$), hydrogen fluoride (HF), diatomic fluoride ($F_2$), monatomic fluorine (F) and fluorine-substituted hydrocarbons, or combinations thereof.

12. The method of claim 9, wherein the substrate is transferred between the first, second, and third processing chambers within one processing system without breaking vacuum.

13. A method for processing a substrate, comprising:
exposing a surface of the substrate to a plasma formed from a first fluorine-containing precursor and a first hydrogen-containing precursor;
exposing the surface of the substrate to hydrogen radical species;
exposing the surface of the substrate to a plasma formed from a second fluorine-containing precursor and a second hydrogen-containing precursor; and then
forming an epitaxial layer on the surface of the substrate.

14. The method of claim 13, further comprising:
between the exposing a surface of the substrate to a plasma formed from a first fluorine-containing precursor and a first hydrogen-containing precursor and the exposing the surface of the substrate to hydrogen radical species, annealing the substrate.

15. The method of claim 13, wherein the substrate is silicon germanium having a concentration of germanium in silicon above about 30%.

16. The method of claim 13, wherein the hydrogen radical species are formed by exposing a hydrogen-containing gas to a hot wire chemical vapor deposition (HWCVD) source.

17. The method of claim 13, wherein the hydrogen radical species are formed by exposing a hydrogen-containing gas to a UV light.

* * * * *